US009806427B2

(12) United States Patent
Ohkoshi et al.

(10) Patent No.: US 9,806,427 B2
(45) Date of Patent: Oct. 31, 2017

(54) ELECTROMAGNETIC WAVE ABSORBER AND FILM FORMING PASTE

(71) Applicants: The University of Tokyo, Tokyo (JP); TOKYO OHKA KOGYO CO., LTD., Kawasaki-shi (JP)

(72) Inventors: Shin-ichi Ohkoshi, Tokyo (JP); Asuka Namai, Tokyo (JP); Marie Yoshikiyo, Tokyo (JP); Takashi Ono, Tokyo (JP)

(73) Assignees: The University of Tokyo, Tokyo (JP); Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/957,235

(22) Filed: Dec. 2, 2015

(65) Prior Publication Data
US 2016/0164187 A1    Jun. 9, 2016

(30) Foreign Application Priority Data

Dec. 3, 2014  (JP) ................................ 2014-245115
Oct. 21, 2015  (JP) ................................ 2015-207316

(51) Int. Cl.
*H01Q 17/00* (2006.01)
*C01G 49/00* (2006.01)
(Continued)

(52) U.S. Cl.
CPC ....... *H01Q 17/007* (2013.01); *C01G 49/0018* (2013.01); *C01G 49/06* (2013.01);
(Continued)

(58) Field of Classification Search
CPC .......................... H01Q 17/007; C01G 49/0018
(Continued)

(56) References Cited

U.S. PATENT DOCUMENTS 5,965,056 A * 10/1999 Okuyama ............ H01Q 17/004
174/388
7,101,488 B2 * 9/2006 Kobayashi .......... C04B 35/2658
252/62.51 R
(Continued)

FOREIGN PATENT DOCUMENTS

JP        2008-277726       11/2008

OTHER PUBLICATIONS

Namai Asuka et al: "High magnetic permeability of [epsilon]-GaxFe2-xO3 magnets in the millimeter wave region", Journal of Applied Physics, American Institute of Physics, US, vol. 107, No. 9, May 13, 2010, pp. 9A955-9A955, XP012134305.
(Continued)

*Primary Examiner* — Marcus E Windrich
(74) *Attorney, Agent, or Firm* — Knobbe, Martens, Olson & Bear, LLP (57) ABSTRACT

A radio wave absorber provided with a radio wave absorbing film formed on a substrate, the radio wave absorber being capable of absorbing radio waves over a broad frequency band and exhibiting superior radio wave absorbing properties even with a radio wave absorbing film thinner than 1 mm. A film forming paste suitable for forming a radio wave absorbing film that is provided in the radio wave absorber. In a radio wave absorber provided with a radio wave absorbing film formed on a substrate, a particular epsilon-type iron oxide is employed in the radio wave absorbing film and relative permittivity of the radio wave absorbing film is set to 6.5 to 65.

9 Claims, 2 Drawing Sheets

(51) Int. Cl.
*C01G 49/06* (2006.01)
*C09C 1/24* (2006.01)
*C09D 5/32* (2006.01)

(52) U.S. Cl.
CPC .................. *C09C 1/24* (2013.01); *C09D 5/32* (2013.01); *H01Q 17/004* (2013.01); *C01P 2004/16* (2013.01); *C01P 2004/62* (2013.01); *C01P 2004/64* (2013.01)

(58) Field of Classification Search
USPC ........................................................ 342/1–4
See application file for complete search history.

(56) References Cited

U.S. PATENT DOCUMENTS

| | | | | |
|---|---|---|---|---|
| 7,108,799 | B2* | 9/2006 | Kobayashi | C04B 35/057 252/61.51 R |
| 9,095,049 | B2* | 7/2015 | Dai | H05K 9/0088 |
| 9,108,388 | B2* | 8/2015 | Egami | B32B 5/08 |
| 2003/0155143 | A1* | 8/2003 | Fujieda | B82Y 10/00 174/354 |
| 2008/0035244 | A1* | 2/2008 | Suzuki | B22F 1/025 148/266 |
| 2010/0171066 | A1* | 7/2010 | Ohkoshi | B82Y 30/00 252/62.57 |
| 2010/0238063 | A1* | 9/2010 | Ohkoshi | B82Y 30/00 342/1 |
| 2012/0100064 | A1* | 4/2012 | Ohkoshi | C09D 7/1216 423/633 |
| 2014/0118177 | A1* | 5/2014 | Appleton | F03D 1/0675 342/1 |

OTHER PUBLICATIONS

Shin-Ichi Ohkoshi et al: "A Millimeter-Wave Absorber Based on Gallium-Substituted $\epsilon$-Iron Oxide Nanomagnets", Angewandte Chemie International Edition, vol. 46, No. 44, Nov. 12, 2007 pp. 8392-8395, XP55266381, DE.
Extended European search report in European Patent Application No. 15197360.9, dated Apr. 26, 2016.

* cited by examiner

ELECTROMAGNETIC WAVE ABSORBER AND FILM FORMING PASTE

This application claims priority to Japanese Patent Application No. 2014-245115, filed Dec. 3, 2014, and Japanese Patent Application No. 2015-207316, filed Oct. 21, 2015, the contents of which are incorporated herein by reference.

BACKGROUND OF THE INVENTION

Field of the Invention

The present invention relates to an electromagnetic wave absorber, in particular a radio wave absorber that absorbs radio waves, and to a film forming paste that can be preferably used for forming an radio wave absorbing film in the radio wave absorber.

Related Art

A high frequency band is increasingly being used in various information communication systems such as cellular telephones, wireless LANs, ETC systems, intelligent transport systems, driving support road systems, satellite broadcasting and the like. However, increasing use of radio waves of the high frequency band involves risk of failure and malfunction of electronic devices due to interference between electronic devices. In order to address such a problem, a method of absorbing unnecessary radio waves by a radio wave absorber has been employed.

Among the uses of the high frequency band radio waves, advanced research has been conducted with regard to driving support systems for automobiles. In such driving support systems for automobiles, a radio wave of a 76 GHz band is used in an in-car radar for detecting a distance between cars and the like. Use of the high frequency band radio waves, for example 100 GHz or higher, is expected to be widespread for various purposes, and not limited to driving support systems for automobiles. As a result, a radio wave absorber that can preferably absorb radio wave of a band of 76 GHz or higher is desired.

In order to meet such a demand, for example, a radio wave absorber provided with a radio wave absorbing film containing magnetic crystals consisting of $\epsilon$-Fe$_2$O$_3$ based iron oxide has been proposed as a radio wave absorber that can preferably absorb radio waves over a broad range in a high frequency band (refer to Japanese Unexamined Patent Application Publication No. 2008-277726).

SUMMARY OF THE INVENTION

Various electronic devices using high frequency band radio waves are being downsized. Therefore, as radio wave absorbers built in electronic devices, smaller and thinner ones are desired. Although the radio wave absorber disclosed in Japanese Unexamined Patent Application Publication No. 2008-277726 preferably absorbs radio waves over a broad frequency band, radio wave absorbing performance may be deteriorated in a case in which a radio wave absorbing film is thin such as less than 1 mm.

The present invention has been made in view of the above described problems, and an objective thereof is to provide a radio wave absorber provided with a radio wave absorbing film formed on a substrate, the radio wave absorber being capable of absorbing radio waves over a broad frequency band and exhibiting superior radio wave absorbing properties even with a radio wave absorbing film thinner than 1 mm. Another objective of the present invention is to provide a film forming paste that can be preferably used for forming a radio wave absorbing film provided in the radio wave absorber.

The present inventors have discovered that the above described problems can be solved by, in a radio wave absorber provided with a radio wave absorbing film formed on a substrate, employing particular epsilon-type iron oxide in the radio wave absorbing film and setting relative permittivity of the radio wave absorbing film to 6.5 to 65, leading to completion of the present invention.

A first aspect of the present invention is a radio wave absorber provided with a radio wave absorbing film formed on a substrate, in which the radio wave absorber has a peak radio wave absorption in a frequency selected from a band of 60-270 GHz;

the radio wave absorbing film comprises epsilon-type iron oxide;

the epsilon-type iron oxide is at least one selected from: $\epsilon$-Fe$_2$O$_3$ crystal; and crystal of which crystalline structure and space group are the same as those of the $\epsilon$-Fe$_2$O$_3$ crystal, in which a part of Fe sites in the $\epsilon$-Fe$_2$O$_3$ crystal is substituted by an element M other than Fe, the crystal being represented by a formula $\epsilon$-M$_x$Fe$_{2-x}$O$_3$ wherein x is greater than 0 and less than 2; and relative permittivity of the radio wave absorbing film is 6.5 to 65.

A second aspect of the present invention is a film forming paste comprising epsilon-type iron oxide that is at least one selected from: $\epsilon$-Fe$_2$O$_3$ crystal; and crystal of which crystalline structure and space group are the same as those of the $\epsilon$-Fe$_2$O$_3$ crystal, in which a part of Fe sites in the $\epsilon$-Fe$_2$O$_3$ crystal is substituted by an element M other than Fe, the crystal being represented by a formula $\epsilon$-M$_x$Fe$_{2-x}$O$_3$ wherein x is greater than 0 and less than 2, in which the film forming paste can form a film of which relative permittivity is 6.5 to 65.

According to the present invention, a radio wave absorber provided with a radio wave absorbing film formed on a substrate can be provided, the radio wave absorber being capable of absorbing radio waves over a broad frequency band and exhibiting superior radio wave absorbing properties even with a radio wave absorbing film thinner than 1 mm. In addition, the present invention can provide a film forming paste that can be preferably used for forming a radio wave absorbing film provided in the radio wave absorber.

DETAILED DESCRIPTION OF THE INVENTION

Radio Wave Absorber

The radio wave absorber according to the present invention is composed of a substrate and a radio wave absorbing film formed thereon. The radio wave absorber contains predetermined epsilon-type iron oxide, and relative permittivity thereof is 6.5 to 65. The radio wave absorber according to the present invention has a peak radio wave absorption in frequency selected from a band of 60-270 GHz. The substrate and the radio wave absorbing film will be described below.

Substrate

The radio wave absorber is provided with a substrate as a material for supporting the radio wave absorbing film. A material for the substrate is not particularly limited; however, a conductor is preferable from the viewpoint of radio wave reflectance properties. The type of the conductor is not particularly limited as long as it does not interfere with the objective of the present invention, and is preferably metal. In a case in which the conductor is composed of metal, the metal as the material for the substrate is preferably aluminum, titanium, SUS, copper, brass, silver, gold, platinum, and the like.

The shape of the substrate is not particularly limited and various shapes can be employed. From the viewpoint of downsizing of the radio wave absorber, a plate-like substrate is generally selected. The plate-like substrate can have a curved surface or be composed only of planar faces. The shape of the substrate is preferably planar, from the viewpoint of easy formation of the radio wave absorbing film having uniform thickness.

In a case in which the substrate is plate-like, the thickness thereof is not particularly limited. The thickness of the substrate is preferably 0.1 μm to 5 cm.

Radio Wave Absorbing Film

The radio wave absorbing film contains particular epsilon-type iron oxide. The relative permittivity of the radio wave absorbing film is a value within the above specified predetermined range. By combining the radio wave absorbing film meeting these conditions with the above described substrate, a radio wave absorber can be obtained that is capable of absorbing radio wave over a broad frequency band and that exhibits superior radio wave absorbing properties even with a radio wave absorbing film thinner than 1 mm.

The thickness of the radio wave absorbing film is not particularly limited as long as it does not interfere with the objective of the present invention. From the viewpoint of downsizing of the radio wave absorber, the thickness of the radio wave absorbing film is preferably less than 3 mm, more preferably at least 150 μm and less than 3 mm, and particularly preferably at least 200 μm and less than 3 mm.

The thickness of the radio wave absorbing film that brings out an optimum radio wave absorbing effect may vary depending on the composition of materials composing the radio wave absorbing film, as well as relative permittivity and relative permeability of the radio wave absorbing film. In this case, it is preferable to optimize the radio wave absorbing effect of the radio wave absorber by fine adjustment of the thickness of the radio wave absorbing film.

Essential and optional components of the radio wave absorbing film, and an adjustment method of relative permittivity and relative permeability of the radio wave absorbing film are described hereinafter.

Epsilon-Type Iron Oxide

As the epsilon-type iron oxide, at least one selected from: $\epsilon\text{-}Fe_2O_3$ crystal; and crystal of which crystalline structure and space group are the same as those of the $\epsilon\text{-}Fe_2O_3$ crystal, in which a part of Fe sites in the $\epsilon\text{-}Fe_2O_3$ crystal is substituted by an element M other than Fe, the crystal being represented by a formula $\epsilon\text{-}M_xFe_{2-x}O_3$ wherein x is greater than 0 and less than 2, is used. Since crystals of the epsilon-type iron oxide are magnetic crystals, such crystals are sometimes referred to as "magnetic crystals" herein.

Any known $\epsilon\text{-}Fe_2O_3$ crystal can be used. The crystal of which crystalline structure and space group are the same as those of the $\epsilon\text{-}Fe_2O_3$ crystal, in which a part of Fe sites in the $\epsilon\text{-}Fe_2O_3$ crystal is substituted by an element M other than Fe, the crystal being represented by a formula $\epsilon\text{-}M_xFe_{2-x}O_3$ wherein x is greater than 0 and less than 2 is described later.

It should be noted that, $\epsilon\text{-}M_xFe_{2-x}O_3$ in which a part of Fe sites in the $\epsilon\text{-}Fe_2O_3$ crystal is substituted by a substitution element is also referred to as "M-substituted $\epsilon\text{-}Fe_2O_3$" herein.

Particle size of a particle having $\epsilon\text{-}Fe_2O_3$ crystal and/or M-substituted $\epsilon\text{-}Fe_2O_3$ crystal in magnetic phase is not particularly limited as long as it does not interfere with the objective of the present invention. For example, the average particle size, which is measured from a TEM (transmission electron microscope) photograph, of a particle having a magnetic crystal of epsilon-type iron oxide in magnetic phase that is manufactured according to a method described later is in a range of 5 to 200 nm.

For example, variation coefficient (standard deviation of particle size/average particle size) of the particles having magnetic crystal of epsilon-type iron oxide in magnetic phase that are manufactured according to the method described later is in a range of less than 80%, which means that the particles are relatively fine and uniform in particle size.

The present invention uses powder of such magnetic particles of epsilon-type iron oxide (in other words, particle having $\epsilon\text{-}Fe_2O_3$ crystal and/or M-substituted $\epsilon\text{-}Fe_2O_3$ crystal in magnetic phase) as a radio wave absorbing material in the radio wave absorbing film. As used herein, the "magnetic phase" is a part of the powder that carries magnetic property.

"Having $\epsilon\text{-}Fe_2O_3$ crystal and/or M-substituted $\epsilon\text{-}Fe_2O_3$ crystal in magnetic phase" means that the magnetic phase is composed of $\epsilon\text{-}Fe_2O_3$ crystals and/or M-substituted $\epsilon\text{-}Fe_2O_3$, and includes a case in which impurity magnetic crystals, which are inevitable in manufacturing, are mixed into the magnetic phase.

Magnetic crystals of epsilon-type iron oxide can include impurity crystals of iron oxide having a space group different from that of $\epsilon\text{-}Fe_2O_3$ crystals (specifically, $\epsilon\text{-}Fe_2O_3$, $\gamma\text{-}Fe_2O_3$, FeO, and $Fe_3O_4$, as well as these crystals in which a part of Fe is substituted by other element).

In a case in which magnetic crystals of epsilon-type iron oxide include impurity crystals, a main phase is preferably magnetic crystals of $\epsilon\text{-}Fe_2O_3$ and/or M-substituted $\epsilon\text{-}Fe_2O_3$. In other words, in magnetic crystals of epsilon-type iron oxide composing the present radio wave absorbing material, a ratio of $\epsilon\text{-}Fe_2O_3$ and/or M-substituted $\epsilon\text{-}Fe_2O_3$ is preferably at least 50 mol % in a molar ratio as a compound.

An abundance ratio of crystals can be obtained by analysis according to Rietveld method based on X-ray diffraction pattern. Non-magnetic compounds generated in the sol-gel process such as silica ($SiO_2$) may be present around the magnetic phase.

(M-Substituted $\epsilon\text{-}Fe_2O_3$)

As long as the M-substituted $\epsilon\text{-}Fe_2O_3$ meets the condition that the crystalline structure and space group are the same as those of the $\epsilon\text{-}Fe_2O_3$ crystal and a part of Fe sites in the $\epsilon\text{-}Fe_2O_3$ crystal is substituted by an element M other than Fe, a type of the element M in the M-substituted $\epsilon\text{-}Fe_2O_3$ is not particularly limited. The M-substituted $\epsilon\text{-}Fe_2O_3$ may include a plurality of types of element M other than Fe.

Preferred examples of the element M include In, Ga, Al, Sc, Cr, Sm, Yb, Ce, Ru, Rh, Ti, Co, Ni, Mn, Zn, Zr and Y. Among these, In, Ga, Al and Rh are preferable. In a case in which M is Al, in a composition represented by ε-$M_xFe_{2-x}O_3$, x is preferably in a range of, for example, at least 0 and less than 0.8. In a case in which M is Ga, x is preferably in a range of, for example, at least 0 and less than 0.8. In a case in which M is In, x is preferably in a range of, for example, at least 0 and less than 0.3. In a case in which M is Rh, x is preferably in a range of, for example, at least 0 and less than 0.3.

According to the present invention, a radio wave absorber having a peak radio wave absorption in a frequency selected from a band of 60-270 GHz, preferably in a band of 60-230 GHz, is provided. The frequency of maximum radio wave absorption can be adjusted by adjusting at least one of type and substitution amount of the element M in the M-substituted ε-$Fe_2O_3$.

Such magnetic crystal of M-substituted ε-$Fe_2O_3$ can be synthesized by a combined process of the reverse micelle method and the sol-gel method described later, as well as a calcination process. M-substituted ε-$Fe_2O_3$ magnetic crystal can also be synthesized by a combined process of the direct synthesis method and the sol-gel method as disclosed in Japanese Unexamined Patent Application Publication No. 2008-174405, as well as a calcination process.

Specifically, M-substituted ε-$Fe_2O_3$ magnetic crystal can be obtained by a combined process of the reverse micelle method and the sol-gel method as disclosed in Jian Jin, Shinichi Ohkoshi and Kazuhito Hashimoto, ADVANCED MATERIALS 2004, 16, No. 1, January 5, pp. 48-51, Shinichi Ohkoshi, Shunsuke Sakurai, Jian Jin, Kazuhito Hashimoto, JOURNAL OF APPLIED PHYSICS, 97, 10K312 (2005), Shunsuke Sakurai, Jian Jin, Kazuhito Hashimoto and Shinichi Ohkoshi, JOURNAL OF THE PHYSICAL SOCIETY OF JAPAN, Vol. 74, No. 7, July, 2005, pp. 1946-1949, Asuka Namai, Shunsuke Sakurai, Makoto Nakajima, Tohru Suemoto, Kazuyuki Matsumoto, Masahiro Goto, Shinya Sasaki, and Shinichi Ohkoshi, Journal of the American Chemical Society, Vol. 131, pp. 1170-1173, 2009 and the like.

In the reverse micelle method, two types of micellar solution containing surfactant, i.e. micellar solution I (material micelle) and micellar solution II (neutralizer micelle), are blended, thereby causing precipitation reaction of ferric hydroxide in the micelle. Thereafter, ferric hydroxide particulates generated in the micelle are subjected to silica coating, by the sol-gel method. The ferric hydroxide particulates with a silica coating layer are separated from liquid and then subjected to heat treatment in an atmospheric environment at a predetermined temperature (in a range of 700 to 1300° C.). This heat treatment gives particulates of ε-$Fe_2O_3$ crystal.

More specifically, M-substituted ε-$Fe_2O_3$ magnetic crystal is manufactured for example as follows.

First, in an aqueous phase of the micellar solution I with an oil phase being n-octane: iron (III) nitrate as an iron source; M nitrate as an M element source for substituting a part of iron (in the case of Al, aluminum (III) nitrate nonahydrate; in the case of Ga, gallium (III) nitrate n-hydrate; and in the case of In, indium (III) nitrate trihydrate); and a surfactant (e.g., cetyltrimethylammonium bromide) are dissolved.

An appropriate amount of nitrate of alkali earth metal (Ba, Sr, Ca, etc.) can be dissolved in advance in the aqueous phase of the micellar solution I. The nitrate functions as a shape controlling agent. Under the presence of alkali earth metal in the solution, rod-shaped particles of M-substituted ε-$Fe_2O_3$ magnetic crystal are obtained. With no shape controlling agent, near-spherical particles of M-substituted ε-$Fe_2O_3$ magnetic crystal are obtained.

The alkali earth metal added as the shape controlling agent may remain on a surface portion of M-substituted ε-$Fe_2O_3$ magnetic crystal being generated. A mass of the alkali earth metal in M-substituted ε-$Fe_2O_3$ magnetic crystal is preferably no greater than 20% by mass and more preferably no greater than 10% by mass with respect to a total mass of the substituting element M and Fe in M-substituted ε-$Fe_2O_3$ magnetic crystal.

Ammonia aqueous solution is used as an aqueous phase of the micellar solution II with an oil phase being n-octane.

After blending the micellar solution I and the micellar solution II, the sol-gel method is applied. That is, stirring is continued during dropwise addition of silane (e.g., tetraethyl orthosilane) to the micellar solution mixture, thereby causing formation reaction of iron hydroxide or iron hydroxide containing element M in a micelle. As a result, a surface of deposited particulates of iron hydroxide generated in the micelle is coated with silica generated by hydrolysis of the silane.

Thereafter, particle powder obtained by separating from liquid, washing, and then drying the silica-coated M element-containing iron hydroxide particles is fed into a furnace, and subjected to heat treatment (calcination) in air in a temperature range of 700-1300° C., preferably 900-1200° C., and more preferably 950-1150° C.

The heat treatment causes an oxidation reaction in the silica coating, thereby changing the particulates of M element-containing iron hydroxide into particulates of M-substituted ε-$Fe_2O_3$.

Upon this oxidation reaction, the silica coating contributes to generation of M-substituted ε-$Fe_2O_3$ having the same space group as ε-$Fe_2O_3$, not ε-$Fe_2O_3$ or γ-$Fe_2O_3$, and has also an effect of preventing sintering of particles. In addition, an appropriate amount of alkali earth metal promotes growth of the particles in a rod-like shape.

In addition, as described above, M-substituted ε-$Fe_2O_3$ magnetic crystal can be synthesized more economically and advantageously by a combined process of the direct synthesis method and the sol-gel method as disclosed in Japanese Unexamined Patent Application Publication No. 2008-174405, as well as a calcination process.

In brief, by firstly adding a neutralizer such as ammonia aqueous solution to an aqueous solvent in which trivalent iron salt and salt of the substitution element M (Ga, Al, etc.) are dissolved while stirring, a precursor composed of iron hydroxide (may partially be substituted by other element) is formed.

Thereafter the sol-gel method is applied thereto, to thereby form a coating layer of silica on a surface of precursor particles. After being separated from the liquid, the silica-coated particles are subjected to the heat treatment (calcination) to thereby obtain particulates of M-substituted ε-$Fe_2O_3$ magnetic crystal.

In the above described synthesis of M-substituted ε-$Fe_2O_3$, iron oxide crystal (impurity crystal) having a space group different from that of ε-$Fe_2O_3$ crystal may be generated. Most common examples of polymorphism, which has a composition of $Fe_2O_3$ with different crystal structures, are ε-$Fe_2O_3$ and γ-$Fe_2O_3$. Other iron oxides include FeO and $Fe_3O_4$.

Presence of such impurity crystals is not preferable for bringing out characteristics of M-substituted ε-$Fe_2O_3$, but is acceptable as long as it does not interfere with the effect of the present invention.

In addition, a coercive force Hc of M-substituted ε-$Fe_2O_3$ magnetic crystal varies depending on an amount substituted by the substitution element M. In other words, by adjusting a substitution amount by the substitution element M in M-substituted $\epsilon$-$Fe_2O_3$ magnetic crystal, the coercive force Hc of M-substituted $\epsilon$-$Fe_2O_3$ magnetic crystal can be adjusted.

More specifically, in a case in which Al, Ga, etc. is used as the substitution element M, a greater substitution amount results in a lower coercive force Hc of M-substituted $\epsilon$-$Fe_2O_3$ magnetic crystal. On the contrary, in a case in which Rh etc. is used as the substitution element M, a greater substitution amount results in a greater coercive force Hc of M-substituted $\epsilon$-$Fe_2O_3$ magnetic crystal.

Ga, Al, In, and Rh are preferred as the substitution element M from the viewpoint of easy adjustment of the coercive force Hc of M-substituted $\epsilon$-$Fe_2O_3$ magnetic crystal according to the substitution amount by the substitution element M.

Along with the lowering of the coercive force Hc, a peak frequency, at which radio wave absorption by epsilon-type iron oxide is maximum, moves toward a lower frequency side or a higher frequency side. That is, a peak frequency of radio wave absorption can be controlled by the substitution amount by the substitution element M.

In a case of commonly used radio wave absorbers, the absorption amount becomes almost zero if an incident angle or frequency of radio wave is out of an expected range. On the contrary, in a case of using epsilon-type iron oxide, even if those values are slightly out of expected ranges, radio wave absorption is possible with a broad frequency band and a broad radio wave incident angle. Given this, the present invention can provide a radio wave absorber that can absorb radio waves of a broad frequency band.

Particle size of the epsilon-type iron oxide can be controlled by adjusting the temperature of the heat treatment (calcination) in the above described process.

According to the combined process of the reverse micelle method and the sol-gel method, or the combined process of the direct synthesis method and the sol-gel method as disclosed in Japanese Unexamined Patent Application Publication No. 2008-174405, particles of epsilon-type iron oxide can be synthesized that has an average particle size, which is measured from a TEM (transmission electron microscope) photograph, in a range of 5 to 200 nm. The average particle size of epsilon-type iron oxide is preferably at least 10 nm and more preferably at least 20 nm.

Upon calculating number average particle size, if the particle of epsilon-type iron oxide is rod-shaped, a diameter in a longitudinal direction of the particle is considered to be a diameter of the particle. The number of particles counted for calculating the average particle size is required to be sufficiently large but not particularly limited; however, preferably at least 300.

In addition, the silica that coats the surface of iron hydroxide particulates in the sol-gel method may remain on the surface of M-substituted $\epsilon$-$Fe_2O_3$ magnetic crystal after the heat treatment (calcination). Presence of non-magnetic compound such as silica on a crystal surface is preferable for improving handleability, durability, and weather resistance of the magnetic crystal.

Preferred examples of non-magnetic compounds other than silica include heat resistant compounds such as alumina and zirconia.

However, an excessive amount of a non-magnetic compound may cause heavy agglutination and is therefore not preferable.

In a case in which the non-magnetic compound is silica, a mass of Si in M-substituted $\epsilon$-$Fe_2O_3$ magnetic crystal is preferably no greater than 100% by mass with respect to a total mass of the substituting element M and Fe in M-substituted $\epsilon$-$Fe_2O_3$ magnetic crystal.

A part or a large part of silica attached to M-substituted $\epsilon$-$Fe_2O_3$ magnetic crystal can be removed by a method of immersion in an alkaline solution. The amount of silica attached can thus be adjusted to a desired amount.

The content of epsilon-type iron oxide in the material composing the radio wave absorbing film is not particularly limited as long as it does not interfere with the objective of the present invention. The content of epsilon-type iron oxide is preferably at least 30% by mass, more preferably at least 40% by mass, particularly preferably at least 60% by mass, and most preferably 60 to 91% by mass with respect to a mass of the material composing the radio wave absorbing film.

Relative Permittivity Adjustment Method

Relative permittivity of the radio wave absorbing film is 6.5 to 65, preferably 10 to 50, and more preferably 15 to 30. A method of adjusting relative permittivity of the radio wave absorbing film is not particularly limited. As a method of adjusting relative permittivity of the radio wave absorbing film, a method of adding dielectric powder to the radio wave absorbing film while adjusting the content of the dielectric powder can be exemplified.

Preferred examples of the dielectrics include a barium titanate, strontium titanate, calcium titanate, magnesium titanate, bismuth titanate, zirconium titanate, zinc titanate, and titanium dioxide. The radio wave absorbing film can include a combination of multiple types of dielectric powder.

The particle size of the dielectric powder used for adjusting relative permittivity of the radio wave absorbing film is not particularly limited as long as it does not interfere with the objective of the present invention. The average particle size of the dielectric powder is preferably 1 to 100 nm and more preferably 5 to 50 nm. The average particle size of the dielectric powder is number average particle size of primary particles of the dielectric powder observed by an electron microscope.

In a case of adjusting relative permittivity of the radio wave absorbing film using the dielectric powder, the amount of the dielectric powder used is not particularly limited as long as the relative permittivity of the radio wave absorbing film is in a predetermined range. The amount of the dielectric powder used is preferably 0 to 20% by mass and more preferably 5 to 10% by mass with respect to a mass of a material composing the radio wave absorbing film.

Alternatively, by adding carbon nanotube to the radio wave absorbing film, the relative permittivity of the radio wave absorbing film can be adjusted. It is more preferable to add carbon nanotube to the radio wave absorbing film for obtaining the radio wave absorbing film with superior radio wave absorbing performance. The carbon nanotube can be used with the above described dielectric powder.

The amount of carbon nanotube in the material composing the radio wave absorbing film is not particularly limited as long as the relative permittivity of the radio wave absorbing film is in a predetermined range. However, since carbon nanotube is also a conductive material, an excessive amount of carbon nanotube may deteriorate radio wave absorbing properties of the radio wave absorber.

Typically, the amount of the carbon nanotube used is preferably 0 to 20% by mass and more preferably 1 to 10% by mass with respect to a mass of the material composing the radio wave absorbing film.

Relative Permeability Adjustment Method

Relative permeability of the radio wave absorbing film is not particularly limited and is preferably 1.0 to 1.5. A method of adjusting relative permeability of the radio wave absorbing film is not particularly limited. As a method of adjusting relative permeability of the radio wave absorbing film, a method of adjusting the substitution amount by the substitution element M in epsilon-type iron oxide as described above, and a method of adjusting a content of epsilon-type iron oxide in the radio wave absorbent film can be exemplified.

Polymer

In order to facilitate formation of a radio wave absorbing film of a uniform thickness in which epsilon-type iron oxide, etc. is uniformly dispersed in the film, the radio wave absorbing film may contain a polymer. If the radio wave absorbing film contains a polymer, a component such as epsilon-type iron oxide can be easily dispersed in a matrix composed of the polymer. In a case in which the radio wave absorbing film is formed by using a film forming paste described later, film forming properties of the film forming paste are improved by including a polymer in the film forming paste.

The type of the polymer is not particularly limited as long as it does not interfere with the objective of the present invention and allows film formation of the radio wave absorbing film. The polymer may also be an elastic material such as an elastomer or a rubber. The polymer can be either a thermoplastic resin or a curing resin. In a case of a curing resin, the curing resin can be either a photosetting resin or a thermosetting resin.

Preferred examples of the polymer being the thermoplastic resin include polyacetal resin, polyamide resin, polycarbonate resin, polyester resin (polybutylene terephthalate, polyethylene terephthalate, polyarylate and the like), FR-AS resin, FR-ABS resin, AS resin, ABS resin, polyphenylene oxide resin, polyphenylene sulfide resin, polysulfone resin, polyethersulfone resin, polyetheretherketone resin, fluorine-based resin, polyimide resin, polyamideimide resin, polyamide bismaleimide resin, polyetherimide resin, polybenzoxazol resin, polybenzothiazol resin, polybenzimidazole resin, BT resin, polymethylpentene, ultra high molecular weight polyethylene, FR-polypropylene, (meta)acrylic resin (polymethylmethacrylate and the like), polystyrene, and the like.

Preferred examples of the polymer being the thermosetting resin include phenolic resin, melamine resin, epoxy resin and alkyd resin. As the photosetting resin, a resin obtained by photosetting of various vinyl monomers or various monomers having an unsaturated bond such as (meth)acrylic ester can be used.

Preferred examples of the polymer being the elastic material include olefin-based elastomer, styrene-based elastomer, polyamide-based elastomer, polyester-based elastomer and polyurethane-based elastomer.

In a case in which the radio wave absorbing film is formed by using the film forming paste described later, the film forming paste can include a dispersion medium and the polymer. In this case, from the viewpoints of applicability of the paste and uniform dispersion of the epsilon-type iron oxide in the polymer, it is preferable that the polymer is soluble in the dispersion medium.

In a case in which the material composing the radio wave absorbing film contains the polymer, the amount of the polymer is not particularly limited as long as it does not interfere with the objective of the present invention. Typically, the content of the polymer is preferably 5 to 30% by mass and more preferably 10 to 25% by mass with respect to a mass of the material composing the radio wave absorbing film.

Dispersant

In order to preferably disperse in the film the epsilon-type iron oxide and the substances added for adjusting relative permittivity and relative permeability, the radio wave absorbing film can contain a dispersant. A method of blending the dispersant into the material composing the radio wave absorbing film is not particularly limited. The dispersant can be blended uniformly along with the epsilon-type iron oxide and the polymer. When materials composing a radio wave absorption film include a polymer, the dispersant may be combined with the polymer. Alternatively, the epsilon-type iron oxide and the substances added for adjusting relative permittivity and relative permeability that are treated with the dispersant in advance can be blended into the material composing the radio wave absorbing film.

The type of the dispersant is not particularly limited as long as it does not interfere with the objective of the present invention. The dispersant can be selected from various dispersants conventionally used for dispersion of various inorganic particulates and organic particulates.

Preferred examples of the dispersant include a silane coupling agent, a titanate coupling agent, a zirconate coupling agent and an aluminate coupling agent.

The content of the dispersant is not particularly limited as long as it does not interfere with the objective of the present invention. The content of the dispersant is preferably 0.1 to 30% by mass, more preferably 1 to 15% by mass, and particularly preferably 1 to 10% by mass with respect to a mass of the material composing the radio wave absorbing film.

Other Components

The material composing the radio wave absorbing film can include various additives in such a range that does not interfere with the objective of the present invention. The additives that the material composing the radio wave absorbing film may contain include a coloring agent, an antioxidant, a UV absorber, a fire retardant, a fire retardant aid, a plasticizer, a surfactant, etc. These additives are used in such a range that does not interfere with the objective of the present invention, taking into consideration conventionally used amounts thereof.

The radio wave absorber according to the present invention is composed by combining the substrate and the radio wave absorbing film described heretofore.

Film Forming Paste

The film forming paste contains the epsilon-type iron oxide described above with regard to the radio wave absorbing film. The film forming paste can contain the substances added for adjusting relative permittivity and relative permeability, the polymer, and other components described above with regard to the radio wave absorbing film. If the polymer is a curing resin, the film forming paste contains a compound which is a precursor of the curing resin. In this case, the film forming paste contains a curing agent, a curing promoter, a polymerization initiator, etc. as necessary.

Composition of the film forming paste is determined such that the relative permittivity of the radio wave absorbing film that is formed by using the paste is within the predetermined range mentioned above.

The film forming paste generally contains a dispersion medium. However, the dispersion medium is not necessary if the film forming paste contains a liquid precursor of a curing resin such as liquid epoxy compound.

As the dispersion medium, water, an organic solvent, and an aqueous solution of organic solvent can be used. An organic solvent, which can easily dissolve organic components and has low latent heat of vaporization allowing easy removal by drying, is preferable as the dispersion medium.

Preferred examples of an organic solvent used as the dispersion medium include: ketones such as diethyl ketone, methylbutyl ketone, dipropylketone, and cyclohexanone; alcohols such as n-pentanol, 4-methyl-2-pentanol, cyclohexanol, and diacetone alcohol; ether-based alcohols such as ethylene glycol monomethyl ether, ethylene glycol monoethyl ether, ethylene glycol monobutyl ether, propylene glycol monomethyl ether, propylene glycol monoethyl ether, diethylene glycol monomethyl ether, diethylene glycol monoethyl ether, diethylene glycol dimethyl ether, and diethylene glycol diethyl ether; saturated aliphatic monocarboxylate alkyl esters such as n-butyl acetate, and amyl acetate; lactate esters such as ethyl lactate, and n-butyl lactate; and ether-based esters such as methylcellosolve acetate, ethylcellosolve acetate, propylene glycol monomethyl ether acetate, propylene glycol monoethyl ether acetate, ethyl-3-ethoxypropionate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, and 4-propoxybutyl acetate, 2-methoxypentyl acetate. These may be used singly or in combination of two or more.

Solid content concentration of the film forming paste is appropriately adjusted according to the thickness of the radio wave absorbing film or a method of applying the film forming paste. Typically, the solid content concentration of the film forming paste is preferably 3 to 60% by mass and more preferably 10 to 50% by mass. The solid content concentration of the paste is calculated by considering a total of a mass of component not dissolved in the dispersion medium and a mass of component dissolved in the dispersion medium as a solid content mass.

Radio Wave Absorber Manufacturing Method

A manufacturing method of the radio wave absorber is not particularly limited. The radio wave absorber can be manufactured either by obtaining the substrate and the radio wave absorbing film separately and then joining the two, or by forming the radio wave absorbing film directly on the surface of the substrate.

In a case of obtaining the substrate and the radio wave absorbing film separately and then joining the two, a method of junction is not particularly limited. As the method of junction, a method of sticking the radio wave absorbing film and the substrate together with an adhesive as necessary can be exemplified. When the radio wave absorbing film is a thick film of, for example, 1 mm or greater, the substrate and the radio wave absorbing film can be joined by using a fastener such as bolts and screws.

In a case in which a component composing the radio wave absorbing film contains a thermoplastic polymer, the radio wave absorbing film can be manufactured using a mixture of essential or optional components contained in the radio wave absorbent film, according to known methods such as extrusion molding, injection molding and press molding. In this case, the radio wave absorber in which the substrate and the radio wave absorbing film are integrated can be formed by a known insert molding method, using the substrate as an insert material.

These methods have an advantage of high production efficiency, but also a disadvantage of difficulty in manufacture of a thin radio wave absorbing film of a thickness of less than 1 mm.

The abovementioned method of using the film forming paste is preferable since the radio wave absorbing film can be formed with high efficiency without a limitation of film thickness, and the radio wave absorbing film can be formed directly on the substrate.

The method of manufacturing the radio wave absorber by applying the film forming paste onto the substrate to thereby form the radio wave absorbing film is described hereinafter.

A method of applying the film forming paste onto the substrate is not particularly limited as long as the radio wave absorbing film of a desired thickness can be formed. For example, application methods include the spray coating method, the dip coating method, the roll coating method, the curtain coating method, the spin coating method, the screen printing method, the doctor blade method, and the applicator method.

The radio wave absorbing film is formed by drying an applied film thus formed to remove the dispersion medium. The film thickness of the applied film is appropriately adjusted such that the radio wave absorption film obtained after drying has a desired thickness.

When the film forming paste contains a photopolymerizing or thermopolymerizing compound, the radio wave absorbing film can be formed by exposing or heating the applied film.

EXAMPLES

Although the embodiments of the present invention will be described hereafter to explain the present invention in further detail, the present invention is not limited by the embodiments below.

Examples 1 to 5 and Comparative Examples 1 to 3

(Preparation of Film Forming Paste)

The epsilon-type iron oxide, carbon nanotube (CNT), barium titanate, the resin and the dispersant were added to terpineol according to the composition shown in Table 1, and these components were uniformly dissolved or dispersed to obtain the film forming paste. The solid content concentration of the film forming paste was adjusted to 40% by mass.

In the Examples and Comparative Examples, $\epsilon\text{-Ga}_{0.45}\text{Fe}_{1.55}\text{O}_3$ was used as the epsilon-type iron oxide. The average particle size of the epsilon-type iron oxide was 20 to 30 nm.

As the carbon nanotube (CNT), multilayered carbon nanotube of 150 nm in diameter in the longitudinal direction were used.

Barium titanate of which average particle size is 10 nm was used.

As the resin, cellulose (methylcellulose) was used.

As the dispersant, a 1:1 mixture (mass ratio) of di(isopropyloxy) di(isostearoyloxy) titanium and vinyl trimethoxysilane was used.

(Manufacture of Radio Wave Absorber)

As the substrate, a planar substrate made of aluminum of 2 mm in thickness was used. The film forming paste prepared according to the above described method was applied onto the substrate by slit coating, to form the applied film. The thickness of the applied film was adjusted such that the thickness of the radio wave absorbing film is as specified in Table 1. The applied film was then dried to obtain the radio wave absorbers of Examples and Comparative Examples. Thickness, relative permittivity, and relative permeability of each radio wave absorber obtained are shown in Table 1.

TABLE 1

| | Composition of radio wave absorbing film (% by mass) | | | | | Film thickness (μm) | Relative permittivity | Relative permeability |
|---|---|---|---|---|---|---|---|---|
| | Epsilon-type iron oxide | CNT | Barium titanate | Resin | Dispersant | | | |
| Ex. 1 | 68.0 | 2.0 | 1.4 | 23.8 | 4.8 | 230 | 17.2 | 1.1 |
| Ex. 2 | 64.9 | 3.9 | 1.3 | 22.7 | 7.1 | 225 | 25.8 | 1.1 |
| Ex. 3 | 66.2 | 4.0 | 0 | 23.2 | 6.6 | 220 | 26.0 | 1.1 |
| Ex. 4 | 66.2 | 4.0 | 0 | 23.2 | 6.6 | 182 | 21.3 | 1.1 |
| Ex. 5 | 64.5 | 5.3 | 0 | 23.0 | 7.2 | 194 | 32.1 | 1.1 |
| Comp. Ex. 1 | 68.9 | 0 | 1.4 | 24.7 | 4.8 | 230 | 6.3 | 1.1 |
| Comp. Ex. 2 | 53.3 | 13.3 | 1.3 | 22.0 | 10.0 | 210 | 69.1 | 1.0 |
| Comp. Ex. 3 | 27.5 | 27.5 | 1.0 | 18.1 | 25.9 | 190 | 85.3 | 1.0 |

The radio wave absorbers of Example 1, Example 2 and Comparative Example 1 were measured for the radio wave absorption characteristics at 45-95 GHz by the free space method using a vector network analyzer. The measurement results are shown in FIG. 1.

The radio wave absorbers of Example 3, Comparative Example 2 and Comparative Example 3 were also measured for the radio wave absorption characteristics at 45-95 GHz frequency band. A measurement result for the radio wave absorber of Example 3 is shown in FIG. 2 along with a measurement result for the radio wave absorber of Example 2.

As a result of measurement, it was found that the radio wave absorbers of Comparative Example 2 and 3 only slightly absorbed radio waves.

Figure 1:
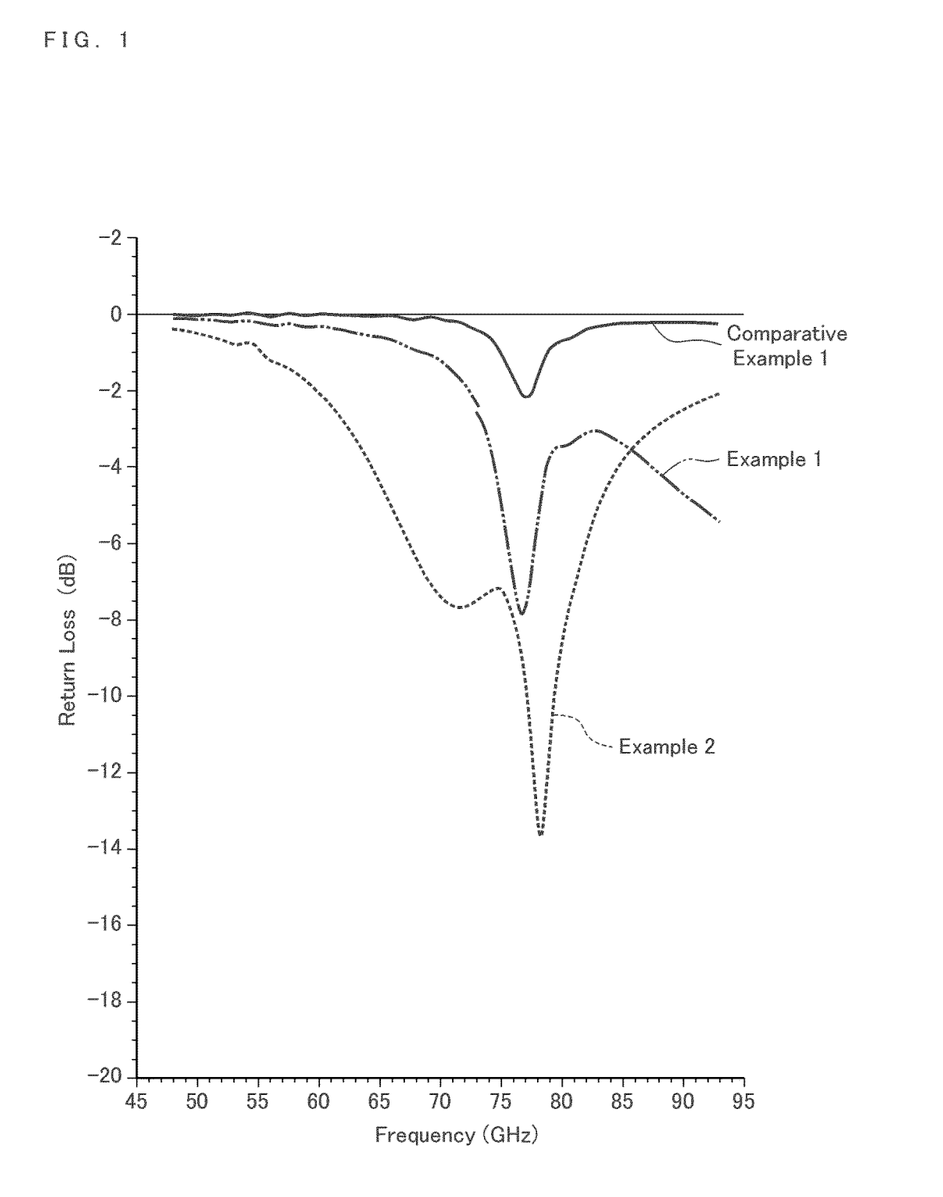
FIG. 1 is a diagram illustrating a relationship between frequency and return loss with regard to radio wave absorbers of Example 1, Example 2, and Comparative Example 1.
Figure 2:
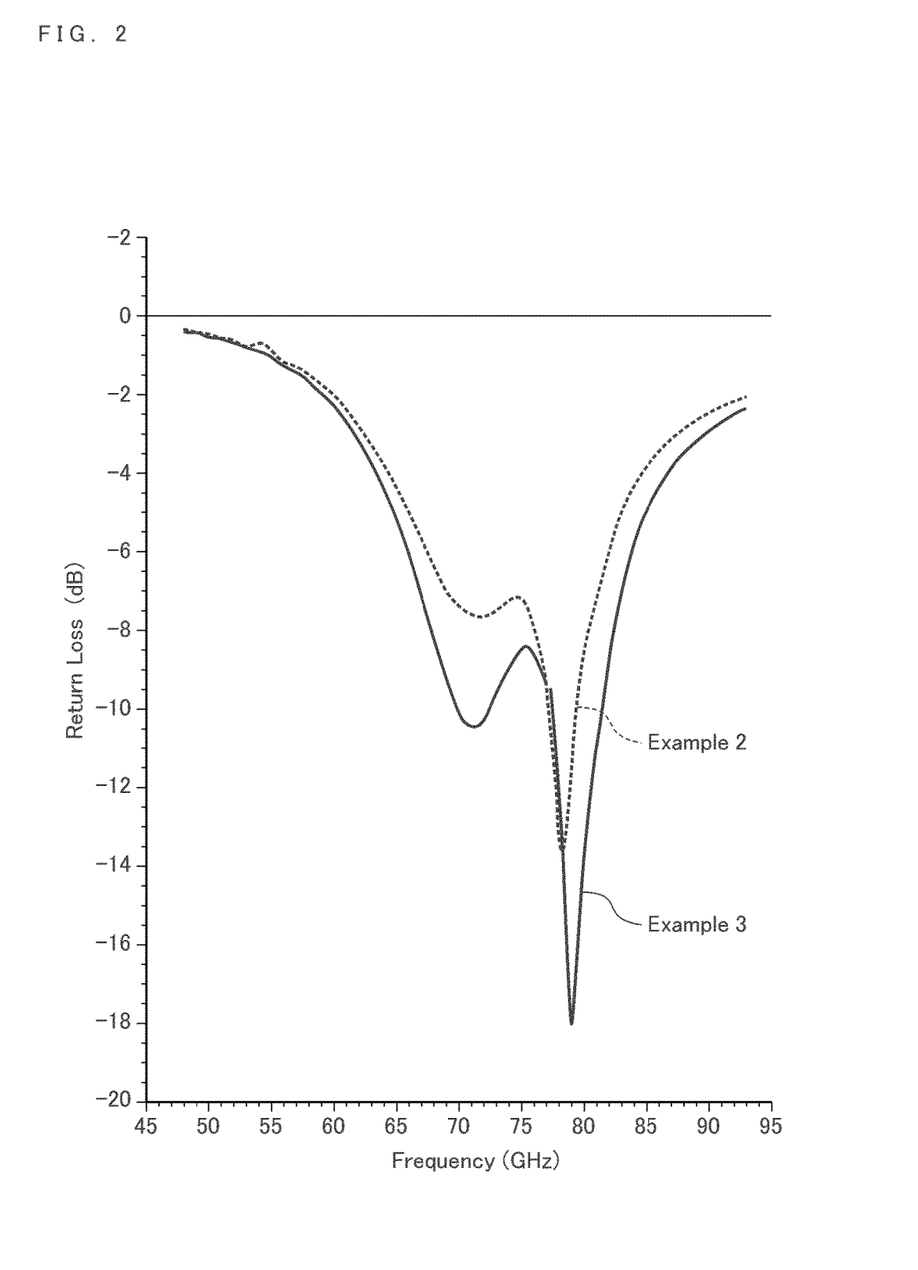
FIG. 2 is a diagram illustrating a relationship between frequency and return loss with regard to radio wave absorbers of Example 2 and Example 3.

According to FIGS. 1 and 2, it is found that the radio wave absorbers of Examples 1 to 3 provided with the radio wave absorbing film containing the epsilon type iron oxide and of which relative permeability is within a predetermined range, have superior radio wave absorption characteristics even if the radio wave absorbing film is thinner than 1 mm.

On the other hand, it is found from Comparative Examples 1 to 3 that the radio wave absorbers provided with the radio wave absorbing film containing the epsilon type iron oxide but of which relative permeability is out of a predetermined range, can hardly absorb radio waves if the radio wave absorbing film is thinner than 1 mm.

What is claimed is:

1. A radio wave absorber comprising a radio wave absorbing film formed on a substrate, wherein:
    the radio wave absorber has a peak radio wave absorption in a frequency selected from a band of 60-270 GHz;
    the radio wave absorbing film comprises an epsilon-type iron oxide and a carbon nanotube;
    the epsilon-type iron oxide is at least one selected from the group consisting of an $\epsilon$-$Fe_2O_3$ crystal and a crystal in which a crystalline structure and space group are the same as those of the $\epsilon$-$Fe_2O_3$ crystal, wherein a portion of Fe sites in the $\epsilon$-$Fe_2O_3$ crystal is substituted by an element M other than Fe, wherein the crystal is represented by a formula $\epsilon$-$M_xFe_{2-x}O_3$ wherein x is greater than 0 and less than 2;
    a relative permittivity of the radio wave absorbing film is 6.5 to 65; and
    the content of the epsilon-type iron oxide relative to total amount of the radio wave absorbing film is at least 30 mass %,
    wherein an amount of the carbon nanotube relative to the total amount of the radio wave absorbing film is in a range from 1 to 10% by mass.

2. The radio wave absorber according to claim 1, wherein the substrate comprises a conductor.

3. The radio wave absorber according to claim 1, wherein the substrate is planar.

4. A film forming paste comprising an epsilon-type iron oxide and a carbon nanotube, wherein the epsilon-type iron oxide is at least one selected from the group consisting of an $\epsilon$-$Fe_2O_3$ crystal and a crystal in which a crystalline structure and space group are the same as those of the $\epsilon$-$Fe_2O_3$ crystal, wherein a portion of Fe sites in the $\epsilon$-$Fe_2O_3$ crystal is substituted by an element M other than Fe, wherein the crystal is represented by a formula $\epsilon$-$M_xFe_{2-x}O_3$ wherein x is greater than 0 and less than 2,
    wherein the film forming paste is capable of forming a film having a relative permittivity of 6.5 to 65, and
    wherein the content of the epsilon-type iron oxide relative to total amount of the radio wave absorbing film is at least 30 mass %,
    wherein an amount of the carbon nanotube relative to the total amount of the radio wave absorbing film is in a range from 1 to 10% by mass.

5. A film formed using the film forming paste according to claim 4.

6. The radio wave absorber according to claim 1, wherein the radio wave absorbing film further comprises a cellulose resin.

7. The radio wave absorber according to claim 1, wherein the radio wave film comprises dielectric powder having an average particle size of 1 to 100 nm.

8. The film forming paste according to claim 4, further comprising a cellulose resin.

9. The film forming paste according to claim 4, comprising dielectric powder having an average particle size of 1 to 100 nm.

* * * * *